(12) United States Patent
Seehof (10) Patent No.: US 9,607,114 B2
(45) Date of Patent: Mar. 28, 2017

(54) ACTIVATION OF A MOTION SYSTEM

(75) Inventor: Carsten Seehof, Braunschweig (DE)

(73) Assignee: Deutsches Zentrum fuer Luft— und Raumfahrt e.V., Cologne (DE)

(*) Notice: Subject to any disclaimer, the term of this patent is extended or adjusted under 35 U.S.C. 154(b) by 515 days.

(21) Appl. No.: 14/122,819

(22) PCT Filed: May 31, 2012

(86) PCT No.: PCT/EP2012/060266
§ 371 (c)(1),
(2), (4) Date: Jan. 24, 2014

(87) PCT Pub. No.: WO2012/164028
PCT Pub. Date: Dec. 6, 2012

(65) Prior Publication Data
US 2014/0163941 A1    Jun. 12, 2014

(30) Foreign Application Priority Data
May 31, 2011    (DE) .................. 10 2011 103 736

(51) Int. Cl.
*G06F 17/10* (2006.01)
*G06F 17/50* (2006.01)
*G09B 9/12* (2006.01)

(52) U.S. Cl.
CPC .......... *G06F 17/5009* (2013.01); *G09B 9/12* (2013.01)

(58) Field of Classification Search
None
See application file for complete search history.

(56) References Cited

U.S. PATENT DOCUMENTS

2014/0087866 A1* 3/2014 Schluesselberger ..... G09B 9/14
463/30

FOREIGN PATENT DOCUMENTS

DE    44 34 660    4/1996

OTHER PUBLICATIONS

Nahon et al. Simulator Modtion-Drive Algorithms: A Designer's Perspective J. Guidance vol. 13, No. 2, s1989.*
Nehaoua et al. Motion Cue Algorithms for Small Driving Simulator Proceedings of the 2006 IEEE International Conference on Robotics and Automation, May 2006.*
Anca Stratulat et al.; "Improving the Realism in Motion-Based Driving Simulators by Adapting Tilt-Translation Technique to Human Perception"; IEEE Virtual Reality Conference, Singapore, Mar. 19-23, 2011; pp. 47-50.
(Continued)

*Primary Examiner* — Omar Fernandez Rivas
*Assistant Examiner* — Cuong Luu
(74) *Attorney, Agent, or Firm* — Whitham, Curtis & Cook, P.C.

(57) ABSTRACT

The invention relates to a method for activating a motion system of a simulator provided for simulating motion and/or acceleration values, wherein at least one acceleration value (1) which is to be simulated is simulated by the motion system being inclined in relation to the earth's vertical, and an additional translatory motion profile (5) of the motion system is determined in order to compensate liar a simulation error (3) until the positioning angle is reached. Activation then takes place in dependence on an inclination profile and the additional translatory motion profile (5).

12 Claims, 4 Drawing Sheets

(56) References Cited

OTHER PUBLICATIONS

Casolo et al.; "Functional Mechanical Design of a Low Cost Driving Simulator"; Proceeding of the 5th International Symposium on Mechatronics and its Application; Amman, Jordan; May 27-29, 2008; pp. 1-6.

Giordano et al.; "A Novel Framework for Closed-Loop Robotic Motion Simulation—Part II: Motion Cueing Design and Experimental Validation"; 2010 IEEE International Conference on Robotics and Automation; Anchorage, Alaska; May 3-8, 2010; pp. 3896-3903.

* cited by examiner

ACTIVATION OF A MOTION SYSTEM

FIELD OF THE INVENTION

The invention relates to a method for activating a motion system of a simulator provided for simulating motion values and/or acceleration values, wherein at least one acceleration value to be simulated is simulated by an inclination of the motion system relative to the perpendicular to the earth, comprising determining an inclination angle profile of the motion system, proceeding from a starting inclination angle of the motion system to an end inclination angle corresponding to the acceleration value to be simulated, taking account of at least one inclination rate.

The invention likewise relates to a device and a simulator for this purpose.

BACKGROUND

Vehicle simulators can be used to simulate motions of a vehicle in the real world, such that the feeling conveyed to the driver of the vehicle is as though the driver were actually controlling a vehicle through the real world. In this regard, the prior art discloses vehicle simulators, for example, in which an image projection device is arranged in the driver's field of view and displays an image of the external surroundings of the vehicle to the driver. If the driver of the vehicle simulator then carries out control tasks, such as acceleration, braking or steering inputs, for example, depending on the control input the image of the surroundings displayed on the image projection device is correspondingly adapted to the control inputs and altered. Such simulators are in this case also known for example from entertainment media and in particular from the field of computer games. In addition to stationary simulators, in which merely the represented external image and the alteration thereof result in a simulation of the alteration and/or accelerations of the vehicle being simulated, simulators are also known which have, in addition thereto, a motion system designed for simulating the occurring motions and accelerations within the simulation in a defined motion space. In this case, within the motion space, depending on the type of simulation, up to six degrees of freedom can be mapped by the motion system, namely firstly the three rotational and secondly the three translational motions in the three spatial axes. Particularly in the simulation of aircraft, motion systems are used for the simulator which make it possible to map the motions of the aircraft in all six degrees of freedom within the motion space.

Apart from a few exceptions, the hydraulically or electromechanically driven motion systems are constructed as parallel robots, the most frequently encountered instances of which by far are in turn the arrangement as a hexapod or Stuart platform.

In such simulators having an active motion system, the high-frequency components of the translational accelerations and the high-frequency components of the rotational velocities are directly mapped into the corresponding degrees of freedom, such that these components of the translational accelerations and of the rotational velocities become perceptible directly on the basis of a motion of the motion system. On account of the restricted motion space of the motion system, however, low-frequency components of the translational accelerations and prolonged or constant translational accelerations cannot be mapped directly by a motion of the motion system, but rather are represented by an inclination of the motion platform or of the motion system. This is because, as a result of an inclination of the motion system and thus of the entire simulator relative to the perpendicular to the earth, on account of the constant acceleration due to gravity, the apparent weight vector within the simulator is altered, such that the impression of a prolonged translational acceleration arises with a positional representation of the external surroundings remaining the same.

The reason for this is the fact that the human body is not able to register a translational acceleration quantitatively correctly, and so the ubiquitous acceleration due to gravity can be used for a prolonged translational acceleration in a simulator. For this there is then merely the restriction that a translational acceleration of more than one g can no longer be correctly represented quantitatively.

In addition to the restriction to the acceleration due to gravity in the simulation of prolonged or constant translational accelerations by means of inclination of the motion system, a further problem is that the motion system has to be brought to the final inclination position by a rotational motion. In this case, the rotation rate or inclination rate of the motion system has to be chosen in such a way that the rotation is not perceived by a person in the simulator and is therefore below the perception threshold. However, this restriction generally results in a time delay until the actual simulation of the translational acceleration by inclination of the motion system, which turns out to be all the greater, the greater the jump in the translational acceleration to be simulated turns out to be. In this regard, for example, the take-off of an aircraft initially cannot be correctly mapped quantitatively by a simulator since the translational acceleration at the start approximately corresponds to a jump function and is then present as substantially constant for quite a while. However, since the motion system has to set the inclination angle in such a way that the rotation rate or inclination rate lies below the human perception threshold, a time delay occurs here until the setting of the desired acceleration value to be simulated, and this is often perceived as disturbing. In the extreme case, this ultimately leads to the occurrence of so-called simulator sickness.

SUMMARY

Against this background, the problem addressed by the present invention is that of specifying an improved method for activating a motion system of a simulator which avoids the disadvantages of the simulators known from the prior art with regard to the low-frequency components or constant translational accelerations to be simulated.

The problem is solved with the method for activating a motion system as mentioned in the introduction according to the invention by determining a translational motion profile of the motion system depending on the acceleration value to be simulated and depending on an acceleration value profile—determined from the inclination angle profile—of simulated acceleration values during the inclination of the motion system in order to reduce a simulation error between the acceleration value to be simulated and the respective simulated acceleration values of the acceleration value profile, and activating the motion system for the simulation of the acceleration value to be simulated depending on the inclination angle profile determined and the translational motion profile determined.

The invention therefore proposes that, in addition to the inclination angle profile, at the end of which an end inclination angle of the motion system is set which then corresponds to the acceleration value to be simulated on account of the rotation of the apparent weight vector in the simulator, there is additionally determined a translational motion profile of the motion system depending on the acceleration value to be simulated and depending on an acceleration value profile—determined from the inclination angle profile—of simulated acceleration values during the inclination of the motion system. The activation of the motion system for the simulation of the acceleration value to be simulated is then effected both depending on the inclination angle profile determined and depending on the translational motion profile determined.

By utilizing the available translational motion space in addition to the inclination of the motion system for the simulation of the translational acceleration, it is possible to reduce the simulation error that exists on account of the time delay until the setting of the end inclination angle. In this case, said simulation error arises on account of the fact that the end inclination angle for the simulation of the acceleration value to be simulated can be set only in a time-delayed manner since the rotation rate or inclination rate has be chosen below the human perception threshold or perception threshold of the person situated in the simulator. If the acceleration value to be simulated rises abruptly, such as during the take-off of an aircraft, for example, then the acceleration value set in the simulator cabin on account of the inclination does not correspond to the acceleration value to be simulated as long as the end inclination angle is not set.

The additional use of the translational motion space during the inclination of the motion system for setting the end inclination angle makes it possible to reduce said simulation error or, under certain circumstances, even completely avoid it, since, as a result of the additional translational motion of the motion system on the basis of the translational motion profile, additional acceleration values are simulated which, together with the inclination profile and the acceleration value profile that can be derived therefrom, correspond to the translational acceleration to be simulated.

By now activating the motion system depending on the inclination angle profile and depending on the translational motion profile determined, what is achieved is that the acceleration value to be simulated is simulated both by a rotational motion for attaining the end inclination angle and by a translational motion of the motion system in combination.

Advantageously, the acceleration value profile could be determined or derived for example by the function $$a(t)=g \cdot \sin(\theta(t))$$

where a(t) is the acceleration value profile, g is the acceleration due to gravity, and θ(t) is the inclination angle profile.

Furthermore, it is especially advantageous if the translational motion profile of the motion system is determined furthermore depending on an available space of the motion system, proceeding from an initial position of the motion system. By taking into consideration the translational motion space still available it is possible to ensure, for example, that the translational motion of the motion system for the compensation of the simulation error does not abruptly end at the end of the motion space of the motion system. This is because the motion space of the motion system is restricted, in principle, and so only motions within the motion space can be carried out.

By taking into consideration the translational motion space still available, proceeding from an initial or actual position of the motion system, it is possible to optimally utilize the motion space with regard to the minimization of the error in order to avoid the parasitic acceleration values as far as possible.

Furthermore, it is especially advantageous if the translational motion profile for minimizing the simulation error is determined furthermore depending on an initial motion of the motion system. As a result, for example in the case of an abrupt rise in an acceleration value to be simulated, this method can be seamlessly integrated into an already controlled motion of the motion system, without the occurrence here of an abrupt change in the motions in a manner atypical of the actual simulation.

Furthermore, it is especially advantageous if the translational motion profile is determined taking account of the boundary condition that a translational motion of the motion system is no longer performed at the point in time when the end inclination angle is attained. This boundary condition that has to be met by the translational motion profile makes it possible, for example, to prevent the occurrence of a jump in the simulated acceleration at the point in time when the end inclination angle is attained.

Furthermore, it is especially advantageous if the inclination angle profile is determined depending on an inclination rate, which can be assumed to be constant or time-dependent and is not more than three degrees per second. For this value, according to current research it can be assumed that the inclination rate lies below the perception threshold, and so an inclination with such an inclination rate is not perceived as rotation, but rather in the vehicle-fixed coordinate system as rotation of the apparent weight vector, which is perceived as acceleration.

In this case, the translational motion profile can advantageously be determined depending on a compensation function which takes account of at least the acceleration value to be simulated and the acceleration value profile determined from the inclination angle profile during the inclination of the motion system. Furthermore, depending on the complexity of the compensation function, the actual state of the motion system in the respective degrees of freedom and the still available motion space derived therefrom can also be concomitantly taken into account in order to be able to determine the translational motion profile by means of the compensation function.

When determining the translational motion profile it has been found that, for example, the following fifth-degree distance function (compensation function) is advantageous for determining the translational motion profile:

$$s(t)=a*t^5+b*t^4+c*t^3+d*t^2+e*t+f.$$

Where the coefficients are as follows:

$$a = \frac{a_{start}}{2t_1^3} - 3\frac{v_{actual}}{t_1^4} - 6\frac{x_{actual} - x_{end}}{t_1^5}$$

$$b = \frac{3a_{start}}{2t_1^2} + 8\frac{v_{actual}}{t_1^3} + 15\frac{x_{actual} - x_{end}}{t_1^4}$$

$$c = \frac{3a_{start}}{2t_1} - 6\frac{v_{actual}}{t_1^2} - 10\frac{x_{actual} - x_{end}}{t_1^3}$$

$$d = \frac{a_{start}}{2}$$

$$e = v_{actual}$$

-continued $$f = x_{actual}$$

In this case, $a_{start}$ represents the starting acceleration, $v_{actual}$ represents the current acceleration of the motion system, $x_{actual}$ represents the current distance of the motion system in the direction under consideration, $x_{end}$ represents the maximum possible distance of the motion system, proceeding from $x_{actual}$, and t represents the time until the end inclination angle is attained.

Since the present method according to the invention has a real-time capability, in principle, it is possible to carry out the calculation anew during the simulation of motion values and/or acceleration values upon each time step. This is because it can happen that during the time period until moving to the end inclination angle, new input acceleration values to be simulated are present which are then intended to be simulated. Taking account of the actual state of the motion system and the motion space thus still available, on the basis of the present method it is thus possible to determine and carry out a recent activation, such that it is possible to react to the changing conditions rapidly and in real time.

Moreover, the problem addressed by the present invention includes specifying an improved device for activating a motion system for simulating motion values and/or acceleration values which avoids the disadvantages known from the prior art in simulators of this type with regard to translational acceleration values.

This problem is solved by a device for activating a motion system of a simulator provided for simulating motion values and/or acceleration values, comprising at least one input interface for proceeding at least one acceleration value to be simulated, and comprising at least one output interface for activating the motion system, said at least one output interface being connectable to the motion system, wherein the device has a computing unit connected to the at least one input interface and output interface, said computing unit being designed for carrying out the above method for activating the motion system.

Moreover, the problem is also solved by a simulator comprising a motion system for simulating motion values and/or acceleration values and an abovementioned device connected to the motion system and provided for activating the motion system.

BRIEF DESCRIPTION OF THE DRAWINGS

The invention will be explained in greater detail by way of example with reference to accompanying drawings, in which.

DETAILED DESCRIPTION

The method according to the invention of the present invention is based on the method known from the prior art that the low-frequency or constant translational acceleration values can be perceptible as a result of an inclination of the motion system. This is because both a constant ongoing translational acceleration of the simulator cabin and an inclination of the simulator cabin are manifested for a person in the simulator in an alteration of the apparent perpendicular or the apparent weight vector relative to the vehicle-fixed coordinate system. In the case of a translational acceleration of the motion system, this apparent perpendicular that can be sensed in the simulator cabin in this case deviates from the actual perpendicular to the earth, while in the case of an inclination of the simulator cabin, the apparent perpendicular corresponds to the perpendicular to the earth. Since the human organism is not able to distinguish the difference between these two types of acceleration, the perpendicular to the earth and the resultant acceleration due to gravity can be used for the simulation of acceleration values.

However, the inclination rate with which the motion system is intended to set an inclination angle for the simulation of a translational acceleration represents a restriction. This is because the inclination rate has to be chosen such that the inclination carried out is not perceptible as such. In general, it has been found that an inclination rate of, for example, not more than three degrees per second lies below the human perception threshold and is therefore not perceived as rotational motion, but rather as a linearly rising translational acceleration.

For the representation of a prolonged translational acceleration, therefore, only the acceleration due to gravity $g=9.81$ m/s$^2$ is available. From this a total acceleration results which can be calculated as follows:

$$|\overline{a_{tot}}| = \sqrt{a_x^2 + a_y^2 + a_z^2}$$

Given an assumed acceleration in the X direction of 4 m/s$^2$, for example, the total acceleration is thus calculated according to the abovementioned formula as:

$$|\overline{a_{tot}}| = \sqrt{(4 \text{ m/s}^2)^2 + (9.81 \text{ m/s}^2)^2} \approx 10.5 \text{ m/s}^2$$

As can be discerned the total acceleration is greater than the maximum representable acceleration due to gravity of 9.81 m/s$^2$. For this case there follows from this a reduction of the actually measurable constant acceleration in X, such that the corrected acceleration vector results as:

$$\overline{a_{const}} = \frac{a_{tot}}{|\overline{a_{tot}}|} \approx \begin{pmatrix} 3.70 \\ 0 \\ 9.09 \end{pmatrix} \text{ m/s}^2$$

On the basis of the example given above with an acceleration to be simulated of 4 m/s$^2$, an angle between the apparent perpendicular as direction of the total acceleration and the z-axis of the simulator cabin pointing toward the center of the earth thus results as follows:

$$\theta_s = \arcsin\left(\frac{a_{tot}}{|\overline{a_{tot}}|}\right) = \arcsin\left(\frac{4 \text{ m/s}^2}{\sqrt{(4 \text{ m/s}^2) + (9.81 \text{ m/s}^2)}}\right) \approx 21.6°$$

As a result of the rotation of the motion system, therefore, an inclination is established which a person in the simulator cabin perceives as rotation of the apparent perpendicular or as rotation of the apparent weight vector relative to the z-axis, while the apparent perpendicular actually corresponds to the perpendicular to the earth. The translational acceleration perceptible as a result of the inclination results in this case as follows:

$$a_{x,tot} = g \cdot \sin(\theta_s).$$

If there then follows a jump in the input acceleration, that is to say in the translational acceleration to be simulated, the simulated acceleration, on account of the restriction of the inclination rate of the translational acceleration to be simulated, lags behind until the corresponding end inclination angle is set, disregarding the constant and the system-inherent error.

Figure 1:
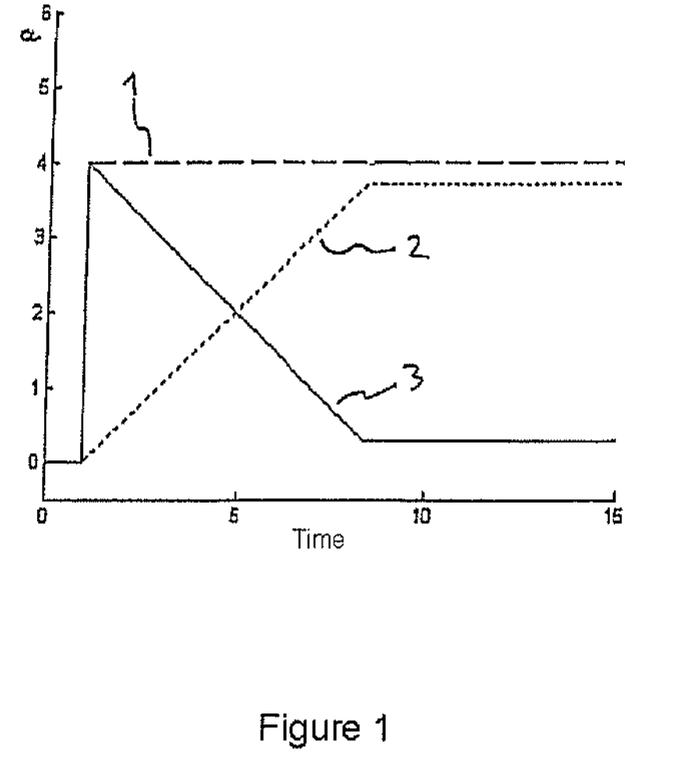
FIG. 1 shows a representation of the error between sensed acceleration and acceleration to be simulated.

This resulting simulation error or apparent perpendicular error is illustrated in FIG. 1. What is to be simulated is a translational acceleration 1 that rose abruptly, such as can be found for example when an aircraft takes off. On account of the restriction of the inclination rate, the translational acceleration 2 established by the inclination angle rises only slowly. The error that results in this case is plotted with the profile 3.

As can be discerned, the error 3 is greatest at the point in time of the beginning of the translational acceleration 1 (point in time $t_0$). As the inclination angle of the motion system is increasingly established, the translational acceleration 2 established by the inclination rises further, such that the error 3 falls to the same extent. The error results here as $$\ddot{x} = \Delta a_x = a_{x,const} - g \cdot \sin(\theta(t)).$$

Where $\theta(t)$ is the inclination angle profile and $a_{x,const}$ is the translational acceleration 1 to be simulated.

The invention now utilizes the available motion space in a translational direction in order to compensate for or reduce this resulting error or simulation error 3, in order thus to achieve a significantly better mapping of the translational acceleration 1 to be simulated by a simulator cabin.

For the translational motion profile which is intended to reduce said simulation error 3, a compensation function is chosen. This might be manifested for example as follows:

$$s(t) = a \cdot t^5 + b \cdot t^4 + c \cdot t^3 + d \cdot t^2 + e \cdot t + f$$

with the coefficients $$a = \frac{a_{start}}{2t_1^3} - 3\frac{v_{actual}}{t_1^4} - 6\frac{x_{actual} - x_{end}}{t_1^5}$$

$$b = \frac{3a_{start}}{2t_1^2} + 8\frac{v_{actual}}{t_1^3} + 15\frac{x_{actual} - x_{end}}{t_1^4}$$

$$c = \frac{3a_{start}}{2t_1} - 6\frac{v_{actual}}{t_1^2} - 10\frac{x_{actual} - x_{end}}{t_1^3}$$

$$d = \frac{a_{start}}{2}$$

$$e = v_{actual}$$

$$f = x_{actual}$$

Where $v_{actual}$ and $x_{actual}$ describe the current state of the motion system in the x-direction and $x_{end}$ is the maximum possible distance for a given motion space until the positional angle or inclination angle was adopted. The time $t_1$ results from the inclination angle to be moved to divided by the maximum permissible rotation rate, which is not identified as such. For this example, a value of 3° per second is assumed.

Further boundary conditions that were taken into account here are:

$$\dot{x}(t_1) = 0$$

$$x(t_0) = x_{start} = a_{start}$$

$$\dot{x}(t_0) = x_{actual} = v_{actual}$$

$$x(t_0) = x_{actual}$$

$$\ddot{x}(t_1) = 0$$

$$x(t_1) = x_{end}$$

Figure 2:
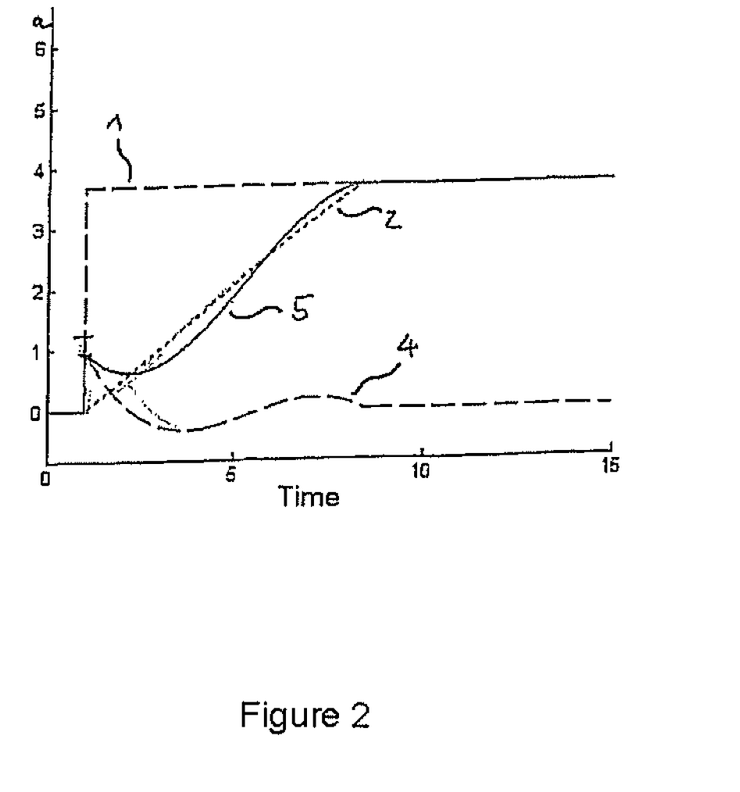
FIG. 2 an optimized acceleration profile with compensation function.

Taking account of the translational motion space and the translational distance still possible for a given actual state of the motion system, it is thus possible to compensate for or at least reduce the simulation error 3 by means of a corresponding translational motion, thus resulting in an optimized acceleration profile as illustrated in FIG. 2. Together with the component of the compensation function 4 as shown above by way of example, a sensed actual acceleration 5 thus results such as is perceived by a person in the simulator upon the interplay of the inclination profile and the additional translational motion. It can be discerned here, in particular, that right after the start the actual acceleration likewise also rises abruptly, and then, on account of the restriction of the motion space of the motion system, this translational motion is slightly driven back in order then again to provide a compensation at the end.

Figure 3:
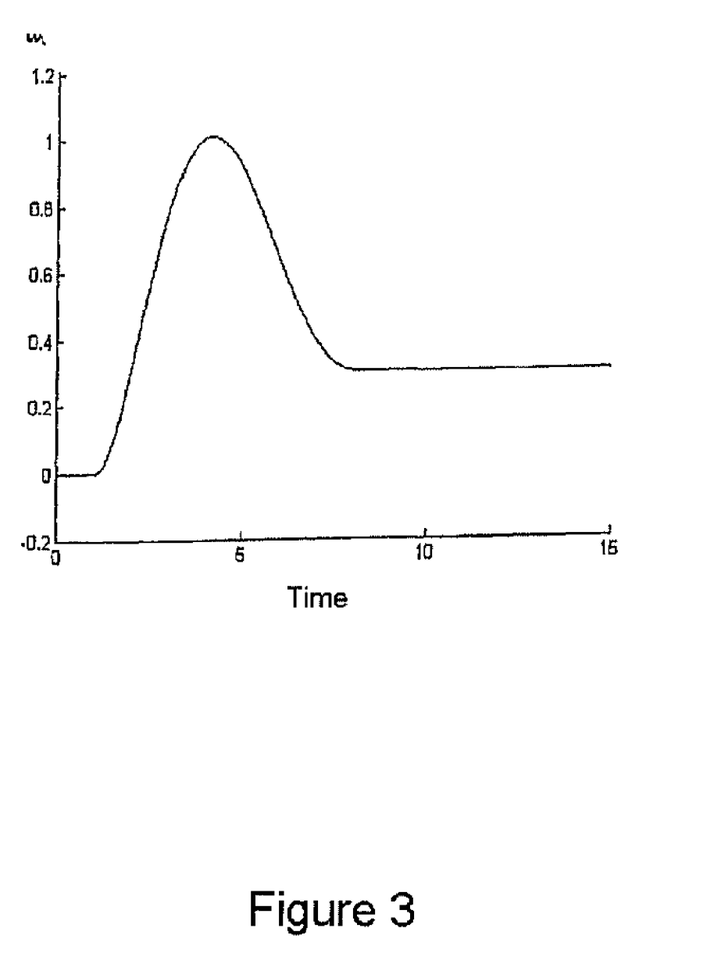
FIG. 3 shows a representation of the distance profile in the case of the translational additional accelerator.

The distance covered here in accordance with the compensation function 4 is illustrated here in FIG. 3.

Figure 4:
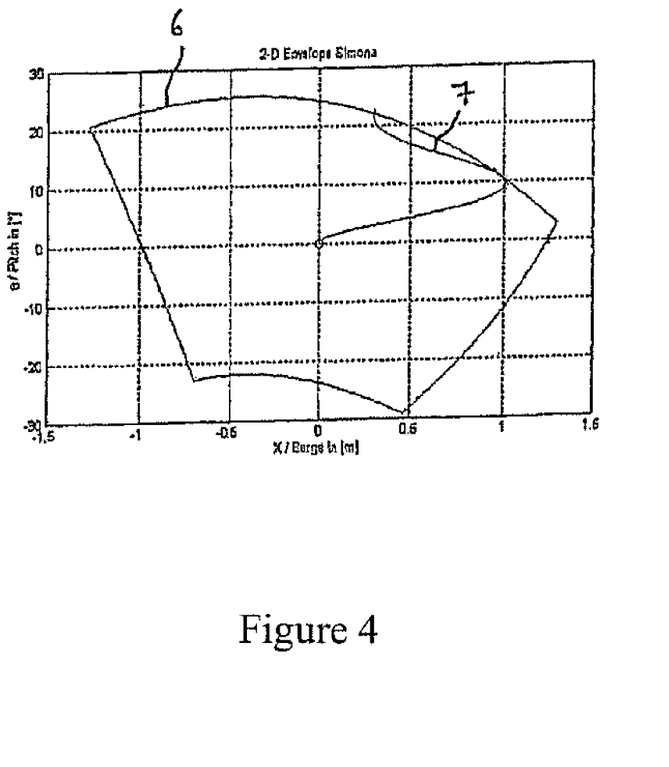
FIG. 4 shows a motion profile in a 2D motion space.

The deflection of the system caused by this acceleration profile is illustrated in FIG. 4 on the basis of a two-dimensional motion space 6. In this case, the motion space 6 also called envelope, describes the possible translational motion freedoms that are still possible for a given actual state of the system. In the example in FIG. 4, here the inclination angle is plotted on the y-axis, while the motion of the motion system in the x-direction is plotted on the x-axis.

The illustrated motion profile 7 shows here in this illustration how the motion system behaves and moves for the simulation of the simulating translational acceleration value. In particular, it can be discerned that a large deflection in the x-direction is carried out in order to compensate for the simulation error in the inclination of the motion system. In this case, the motion system is moved as far as the edge of the possible motion space in order thus to be able to fully utilize the translational motion space. The function presented in the example mentioned involves slight driving back in order to introduce a translational acceleration again at the end, i.e. shortly before the end inclination angle is obtained, in order to avoid a jump when the end inclination angle is obtained.

The invention claimed is:

1. A method for activating a motion system of a simulator provided for simulating motion values and/or acceleration values, wherein at least one acceleration value to be simulated is simulated by an inclination of the motion system relative to the perpendicular to the earth, comprising:
   providing the at least one acceleration value to be simulated,
   determining an inclination angle profile of the motion system comprising simulated acceleration values, proceeding from a starting inclination angle of the motion system to an end inclination angle corresponding to the at least one acceleration value to be simulated, taking account of at least one inclination rate,
   determining a simulation error based on the at least one acceleration value to be simulated and the inclination angle profile of the motion system due to a restriction of the inclination rate for the at least one acceleration value to be simulated,
   determining a translational motion profile of the motion system based on the simulation error during the inclination of the motion system in order to reduce the simulation error between the at least one acceleration value to be simulated and the simulated acceleration values of the inclination angle profile, and activating the motion system for the simulation of the at least one acceleration value to be simulated depending on the inclination angle profile determined and the translational motion profile determined, wherein determining the translational motion profile of the motion system further depends on an available motion space of the motion system, proceeding from an initial position of the motion system.

2. The method as claimed in claim 1, further comprising determining an acceleration value profile, wherein determining the acceleration value profile involves the function $$a(t) = g * \sin(\theta(t))$$

where a(t) is the acceleration value profile, g is the acceleration due to gravity, and θ(t) is the inclination angle profile.

3. The method as claimed in claim 1, wherein determining the translational motion profile of the motion system further depends on an initial motion of the motion system.

4. The method as claimed in claim 1, wherein determining the translational motion profile takes account of the boundary condition that a translational motion of the motion system is no longer performed at the point in time when the end inclination angle is attained.

5. The method as claimed in claim 1, wherein determining the inclination angle profile depends on a constant or time-dependent inclination rate.

6. A method for activating a motion system of a simulator provided for simulating motion values and/or acceleration values, wherein at least one acceleration value to be simulated is simulated by an inclination of the motion system relative to the perpendicular to the earth, comprising:

providing the at least one acceleration value to be simulated, determining an inclination angle profile of the motion system comprising simulated acceleration values, proceeding from a starting inclination angle of the motion system to an end inclination angle corresponding to the at least one acceleration value to be simulated, taking account of at least one inclination rate, determining a simulation error based on the at least one acceleration value to be simulated and the inclination angle profile of the motion system due to a restriction of the inclination rate for the at least one acceleration value to be simulated, determining a translational motion profile of the motion system based on the simulation error during the inclination of the motion system in order to reduce the simulation error between the at least one acceleration value to be simulated and the simulated acceleration values of the inclination angle profile, and activating the motion system for the simulation of the at least one acceleration value to be simulated depending on the inclination angle profile determined and the translational motion profile determined, wherein determining the translational motion profile depends on the following distance function:

$$s(t) = a \cdot t^5 + b \cdot t^4 + c \cdot t^3 + d \cdot t^2 + e \cdot t + f$$

where $$a = \frac{a_{start}}{2t_1^3} - 3\frac{v_{actual}}{t_1^4} - 6\frac{x_{actual} - x_{end}}{t_1^5}$$

$$b = \frac{3a_{start}}{2t_1^2} + 8\frac{v_{actual}}{t_1^3} + 15\frac{x_{actual} - x_{end}}{t_1^4}$$

$$c = \frac{3a_{start}}{2t_1} - 6\frac{v_{actual}}{t_1^2} - 10\frac{x_{actual} - x_{end}}{t_1^3}$$

$$d = \frac{a_{start}}{2}$$

$$e = v_{actual}$$

$$f = x_{actual}$$

where $a_{start}$ is the starting acceleration, $v_{actual}$ is the current acceleration of the motion system, $x_{actual}$ is the current distance of the motion system in the direction under consideration, $x_{end}$ is the maximum possible distance of the motion system, proceeding from $x_{actual}$, and t is the time until the end inclination angle is attained.

7. A device for activating a motion system of a simulator provided for simulating motion values and/or acceleration values, comprising at least one input interface for predefining at least one acceleration value to be simulated, and comprising at least one output interface for activating the motion system, said at least one output interface being connectable to the motion system, wherein the device has a computing unit connected to the at least one input interface and output interface, said computing unit being configured to perform the method of claim 1 for activating the motion system.

8. A simulator comprising a motion system for simulating motion values and/or acceleration values and a device as claimed in claim 7 connected to the motion system and provided for activating the motion system.

9. The method as claimed in claim 1, wherein determining the inclination angle profile depends on a time-dependent inclination rate of 3° per second.

10. A method for activating a motion system of a simulator provided for simulating motion values and/or acceleration values, wherein at least one acceleration value to be simulated is simulated by an inclination of the motion system relative to the perpendicular to the earth, the method comprising:

providing the at least one acceleration value to be simulated;

determining an inclination angle profile of the motion system comprising simulated acceleration values such that a time delay exists between (i) a change in the at least one acceleration value to be simulated and (ii) a corresponding change in a sensed actual acceleration contributed by the inclination of the motion system, wherein the inclination angle profile proceeds from a starting inclination angle of the motion system to an end inclination angle corresponding to the at least one acceleration value to be simulated, taking account of at least one inclination rate;

determining a simulation error based on the at least one acceleration value to be simulated and the inclination angle profile of the motion system due to a restriction of the inclination rate for the least one acceleration value to be simulated; and reducing the simulation error between the sensed actual acceleration perceived by a person in the simulator and the at least one acceleration value to be simulated, wherein reducing the simulation error includes determining a translational motion profile of the motion system based on the simulation error during the inclination of the motion system, and activating the motion system for the simulation of the at least one acceleration value to be simulated based on the determined inclination angle profile and the determined translational motion profile, wherein an interplay of the determined inclination angle profile and the determined translational motion profile provides the sensed actual acceleration perceived by the person in the simulator.

11. The method of claim 10, wherein the acceleration value to be simulated involves a jump function, and wherein the translational motion profile is determined such that it contributes an abrupt increase to the sensed actual acceleration corresponding with a start of the jump function.

12. The method of claim 10, wherein the translational motion profile is determined such that it further provides a compensatory acceleration coinciding with an end of the inclination angle profile prior to the inclination angle profile reaching the end inclination angle corresponding to the acceleration value to be simulated.

* * * * *